US012712003B2

(12) United States Patent
Lee

(10) Patent No.: US 12,712,003 B2
(45) Date of Patent: Aug. 18, 2026

(54) MAGNETIC RANDOM ACCESS MEMORY BASED ON THE FERROMAGNETIC FILM WITH BIAXIAL ANISOTROPY USING SPIN-ORBIT TORQUE

(71) Applicant: KOREA UNIVERSITY RESEARCH AND BUSINESS FOUNDATION, Seoul (KR)

(72) Inventor: Sanghoon Lee, Seoul (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 104 days.

(21) Appl. No.: 18/670,843

(22) Filed: May 22, 2024

(65) Prior Publication Data

US 2024/0395300 A1 Nov. 28, 2024

(30) Foreign Application Priority Data

May 22, 2023 (KR) ........................ 10-2023-0065645

(51) Int. Cl.
*G11C 11/16* (2006.01)
*H10B 61/00* (2023.01)
(Continued)

(52) U.S. Cl.
CPC ........ *G11C 11/161* (2013.01); *G11C 11/1673* (2013.01); *G11C 11/1675* (2013.01);
(Continued)

(58) Field of Classification Search
CPC .............. G11C 11/161; G11C 11/1673; G11C 11/1675; H10B 61/00; H10N 50/10;
(Continued)

(56) References Cited

U.S. PATENT DOCUMENTS

2009/0003042 A1* 1/2009 Lee ........................ H10N 50/10
365/158
2011/0170339 A1* 7/2011 Wunderlich ............ G11C 11/16
365/158
(Continued)

FOREIGN PATENT DOCUMENTS

KR 10-0253743 B1 4/2000
KR 10-0862183 B1 10/2008
(Continued)

OTHER PUBLICATIONS

Sangyeop Lee et al., "Field-free manipulation of magnetization alignments in a Fe/GaAs/GaMnAs multilayer by spin-orbit-induced magnetic fields", Scientific Reports 7, Article No. 10162, Aug. 31, 2017, pp. 1-9, DOI:10.1038/s41598-017-10621-6.
(Continued)

*Primary Examiner* — Jerome Leboeuf
(74) *Attorney, Agent, or Firm* — Hauptman Ham, LLP

(57) ABSTRACT

A magnetic random access memory (MRAM) device includes a substrate and a ferromagnetic layer formed on the substrate, and the ferromagnetic layer has biaxial anisotropy. Information stores in a cell only with current pulses, which switches magnetization between easy-axes, because spin-orbit field component along easy axes changes with current direction. This leads to an increase in the operating efficiency of the memory device.

5 Claims, 5 Drawing Sheets

(51) Int. Cl.
*H10N 50/10* (2023.01)
*H10N 50/85* (2023.01)
*H01F 1/147* (2006.01)

(52) U.S. Cl.
CPC ............. *H10B 61/00* (2023.02); *H10N 50/10* (2023.02); *H10N 50/85* (2023.02); *H01F 1/147* (2013.01)

(58) Field of Classification Search
CPC ...... H10N 50/85; H10N 52/101; H10N 52/85; H01F 1/147
See application file for complete search history.

(56) References Cited

U.S. PATENT DOCUMENTS

2019/0385655 A1* 12/2019 Lin ........................ H10B 61/22
2022/0328757 A1* 10/2022 Pereira de Sousa ... H10N 52/00

FOREIGN PATENT DOCUMENTS

KR 10-1774937 B1 9/2017
KR 10-2021-0052141 A 5/2021

OTHER PUBLICATIONS

Sanghoon Lee et al., “Spin-Orbit-Induced Effective Magnetic Field in GaMnAs Ferromagnetic Semiconductor”, IEEE Transactions on Magnetics, vol. 55, No. 2, Feb. 2019, 6 pages.
Sangyeop Lee et al., “Manipulation of magnetization in GaMnAs films by spin-orbit-induced magnetic fields”, Current Applied Physics, vol. 17, Issue 5, 2017, pp. 801-805.

* cited by examiner

MAGNETIC RANDOM ACCESS MEMORY BASED ON THE FERROMAGNETIC FILM WITH BIAXIAL ANISOTROPY USING SPIN-ORBIT TORQUE

CROSS-REFERENCE TO RELATED APPLICATION(S)

This application claims the benefit under 35 USC § 119(a) of Korean Patent Application No. 10-2023-0065645 filed on May 22, 2023, in the Korean Intellectual Property Office, the entire disclosure of which is incorporated herein by reference for all purposes.

BACKGROUND

1. Field

The present invention relates to a magnetic random access memory (MRAM) device, and more particularly, to an MRAM device that operates only with current without an external magnetic field using a spin-orbit field that is generated due to current flow in a single layer of ferromagnetic material with in-plane biaxial anisotropy.

2. Description of Related Art

In general, a magnetic random access memory (MRAM) device refers to an inactive device and is playing an important role as a memory device that replaces dynamic random access memory (DRAM), static random access memory (SRAM), and flash memory currently used, but has disadvantages of requiring a large amount of current during a device operation in addition to a complex device structure. To solve the aforementioned disadvantages of the MRAM device, research is actively ongoing to simplify a device structure and to enable a fast operation at low current.

The conventional MRAM device includes a magnetic layer configured to record information and a heavy metal layer (or another magnetic layer) configured to generate spin current. In particular, in the case of a spin-orbit torque (SOT) MRAM device, auxiliary layers required to replace the external magnetic field necessary for complete switching with an effective magnetic field within the structure are essentially included. That is, this is the principle of controlling magnetization by delivering the spin current generated in the heavy metal layer to the magnetic layer, applying spin-orbit torque (SOT) to the magnetization of the magnetic layer in the presence of effective magnetic fields from the auxiliary layers. Also, since a method of sensing information recorded on magnetization uses a giant magneto resistance (GMR) or tunneling magneto resistance (TMR) phenomenon, a spin-transfer torque and spin-orbit torque MRAM device has a complex structure in which at least two magnetic layers are included as shown in FIG. 1.

Referring to FIG. 1, a conventional SOT MRAM device is configured to include a soft magnetic layer (e.g., soft magnet) that performs an information storage role, a heavy metal layer that generates spin current, and a hard magnetic layer that performs a sensing role.

Here, a magnetization direction of the soft magnetic layer is recorded by flowing current into a word line formed by the heavy metal layer and the recorded magnetization direction is read by detecting a change in resistance according to the relative alignment of magnetization direction between two magnetic layers through the current in a vertical direction.

As described above, since the conventional SOT MRAM device has a complex multi-layer structure that includes a soft magnetic layer for information storage, a heavy metal layer for spin current generation, and an auxiliary layer for writing information to a magnetic layer, and an additional spin-valve structure, consisting of at least two magnetic layers, to perform reading operation, there is an issue of difficulty in processing such a complicate device structure, resulting low productivity.

The present invention is conceived to solve the above issue and an objective of the present invention is to provide an MRAM device that may simplify a device structure using a single layer of ferromagnetic material having both non-centrosymmetric crystal structure and in-plane biaxial anisotropy. Thus, the present invention may improve process efficiency by reducing a manufacturing process.

Another objective of the present invention is to provide an MRAM device that may reduce magnitude of current required for magnetization control by using spin polarization occurring in a ferromagnetic material itself and may increase energy efficiency of a device operation.

SUMMARY

A technical subject to be achieved by the present invention is to provide an in-plane biaxial anisotropy-based magnetic random access memory (MRAM) device.

A magnetic random access memory (MRAM) device according to an example embodiment of the present invention includes a substrate and a ferromagnetic layer formed on the substrate, and the ferromagnetic layer has biaxial in-plane magnetic anisotropy.

Also, the ferromagnetic layer may be a ferromagnetic material having a non-centrosymmetric crystal structure and may include gallium manganese arsenide (GaMnAs) or manganese bismuth (MnBi).

Also, during a write operation, current in a first direction is applied to the ferromagnetic layer so that a magnetization state of the ferromagnetic layer switches from a first magnetization state to a second magnetization state.

Also, during the write operation, current in a second direction, that is opposite to the first direction, is applied to the ferromagnetic layer so that the magnetization state of the ferromagnetic layer switches from the second magnetization to the first magnetization state.

Also, during a read operation, information stored in the MRAM device is identified based on a planar Hall resistance value of the ferromagnetic layer.

In the present invention, information can store in a cell only with current pulses, which switches magnetization between easy-axes, because spin-orbit field component along easy axes changes with current direction. This may lead to an increase in the operating efficiency of the memory device.

Also, compared to the existing spin-orbit torque (SOT) MRAM device including heavy metal/ferromagnetic junction multi-layer, device implementation may be performed only with a single magnetic layer. Therefore, by simplifying a structure of the entire memory device, it is possible to improve a process efficiency and to achieve a high integration.

BRIEF DESCRIPTION OF THE DRAWINGS

These and/or other aspects, features, and advantages of the disclosure will become apparent and more readily appreciated from the following description of example embodiments, taken in conjunction with the accompanying drawings of which.

DETAILED DESCRIPTION

Figure 1:
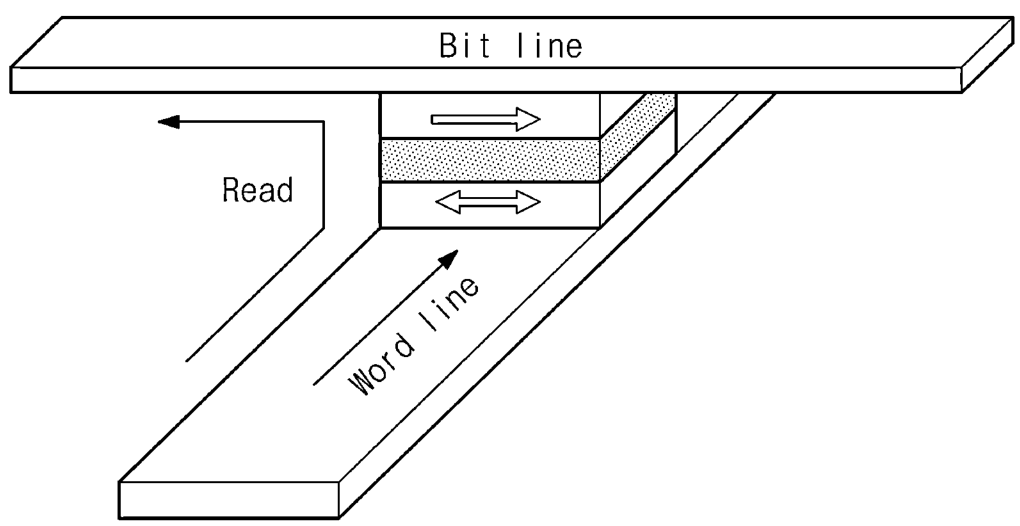
FIG. 1 illustrates a magnetic random access memory (MRAM) device according to the related art.

The aforementioned features and effects of the disclosure will be apparent from the following detailed description related to the accompanying drawings and accordingly those skilled in the art to which the disclosure pertains may easily implement the technical spirit of the disclosure.

Various modifications and/or alterations may be made to the disclosure and the disclosure may include various example embodiments. Therefore, some example embodiments are illustrated as examples in the drawings and described in detailed description. However, they are merely intended for the purpose of describing the example embodiments described herein and may be implemented in various forms. Therefore, the example embodiments are not construed as limited to the disclosure and should be understood to include all changes, equivalents, and replacements within the idea and the technical scope of the disclosure.

Although terms of “first,” “second,” and the like are used to explain various components, the components are not limited to such terms. These terms are used only to distinguish one component from another component.

For example, a first component may be referred to as a second component, or similarly, the second component may be referred to as the first component within the scope of the present disclosure. As used herein, the term “and/or” includes any and all combinations of one or more of the associated listed items.

As used herein, the singular forms “a,” “an,” and “the” are intended to include the plural forms as well, unless the context clearly indicates otherwise. It will be further understood that the terms “comprises” and/or “comprising,” when used in this specification, specify the presence of stated features, integers, steps, operations, elements, components or a combination thereof, but do not preclude the presence or addition of one or more other features, integers, steps, operations, elements, components, and/or groups thereof.

Hereinafter, example embodiments will be described with reference to the accompanying drawings. However, the scope of the patent application is not limited to or restricted by such example embodiments. Like reference numerals used herein refer to like elements throughout.

Figure 2:
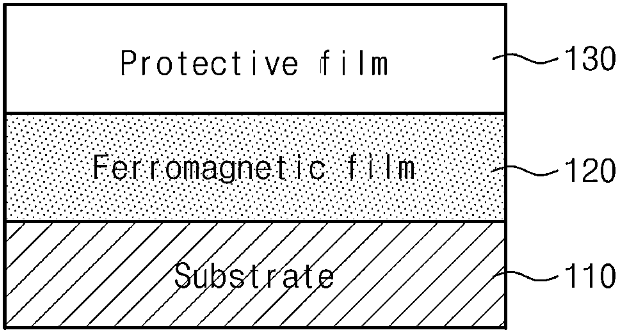
FIG. 2 illustrates a structure of a MRAM device according to an example embodiment of the present invention.

FIG. 2 illustrates a structure of a magnetic random access memory (MRAM) device according to an example embodiment of the present invention.

Referring to FIG. 2, the MRAM device includes a substrate 110 and a ferromagnetic layer 120 formed on the substrate 110 and configured to store (write) information using a magnetization state and to sense (read) the stored information through a planar Hall resistance (PHR) value. Depending on example embodiments, the MRAM device may further include an (insulating) protective film 130 formed on the ferromagnetic layer 120. The ferromagnetic layer 120 may be implemented as a ferromagnetic film.

During a write operation of the MRAM device, the spin-orbit field may be generated in the ferromagnetic layer 120 by applying current (in pulse form) to the MRAM device (more specifically, which may represent the ferromagnetic layer 120), magnetization of the ferromagnetic layer 120 with biaxial magnetic anisotropy may be rotated by 90 degrees during current pulse, and information (or data) may be store by recording a planar Hall resistance value that varies according to the magnetization state. Here, the planar Hall resistance value may be measured according to Equation 1.

$$R_{PHE} = \frac{k}{t} M^2 \sin 2\phi_M \quad \text{[Equation 1]}$$

Here, k denotes a planar Hall effect constant, t denotes a thickness of the ferromagnetic layer 120, and φ denotes a magnetization direction. The ferromagnetic layer 120 may be a ferromagnetic material formed of a material, such as (III,M)(V) having a anon-centrosymmetric crystalline structure, such as zinc-blende. Here, III, V, and M are group 3, group 5, and transition element of the periodic table, respectively.

Figure 3:
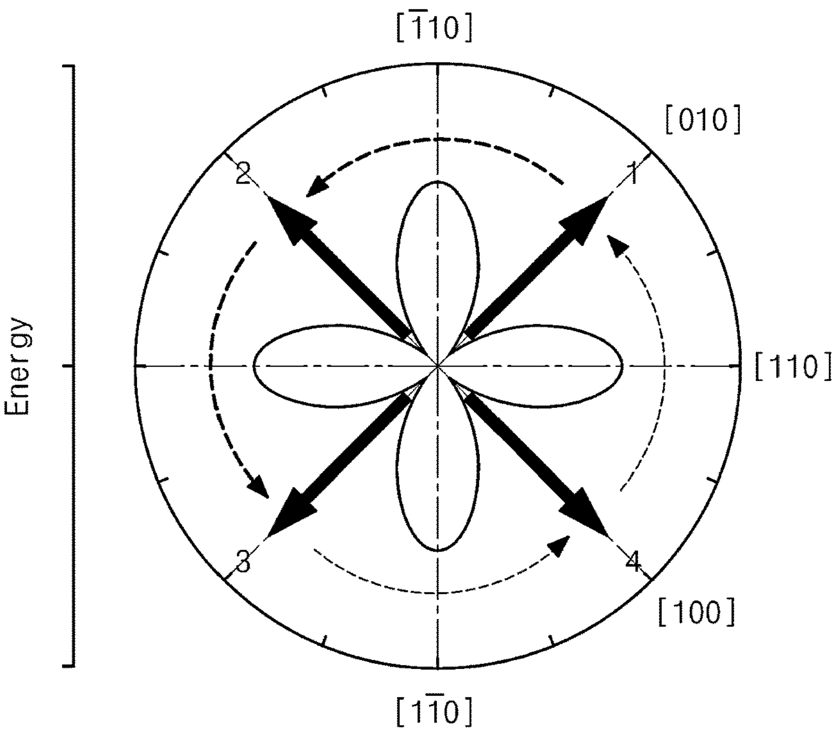
FIG. 3 illustrates in-plane magnetic anisotropy in the crystalline thin film that appears when cubic anisotropy is strong in a ferromagnetic film with a non-centrosymmetric crystal structure.

FIG. 3 illustrates in-plane magnetic anisotropy in the crystalline thin film that appears when cubic anisotropy is strong in a ferromagnetic film with a non-centrosymmetric crystal structure, such as zinc-blende. In this case, two axes with minimum anisotropy energy are present in the [100] and [010] crystalline directions (biaxial anisotropy) and thus, stable magnetization states are achieved in directions indicated by 1, 2, 3, and 4.

Figure 4:
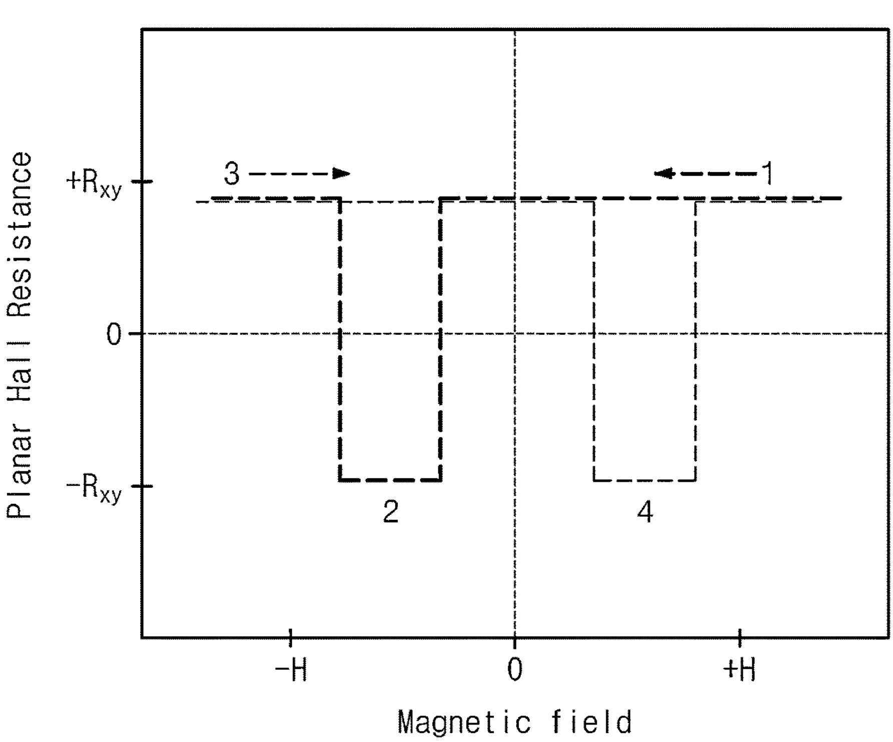
FIG. 4 illustrates a planar Hall resistance value given by Equation 1 when a magnetization state changes along four minimum anisotropic energy directions shown in FIG. 3.

FIG. 4 illustrates a planar Hall resistance value given by Equation 1 when a magnetization state changes along four minimum anisotropic energy directions shown in FIG. 3. Since magnetization has different values on two axes of biaxial anisotropy, information may be stored according to a magnetization direction. For magnetization state switching within the thin film plane by the spin-orbit field, a spin-orbit field component in the direction of a stable magnetization state is required. This is possible since the biaxial anisotropy along the <100> crystal directions present in a ferromagnetic layer and the spin-orbit field along the <110> crystal directions induced by the current form an angle of 45 degrees.

Therefore, information recorded (or stored) in the MRAM device may be read by comparing a measured planar Hall resistance value and a predetermined reference value. For example, if the measured planar Hall resistance value is greater than the predetermined reference value, the recorded information may be 0 (or 1), and if the measured planar Hall resistance value is less than the predetermined reference value, the recorded information may be 1 (or 0). Depending on example embodiments, a plurality of reference values may be predetermined. For example, if the measured planar Hall resistance value is greater than a first reference value, the recorded information may be 0 (or 1), and if the measured planar Hall resistance value is less than a second reference value, the recorded information may be 1 (or 0). Here, the first reference value may have a value greater than the second reference value. As another example, the recorded information may be read based on a sign of the measured planar Hall resistance value. For example, if the measured planar Hall resistance value is a positive number, the recorded information may be 0 (or 1), and if the measured planar Hall resistance value is a negative number, the recorded information may be 1 (or 0).

Referring again to FIG. 2, the MRAM device may include the substrate 110 and the ferromagnetic layer 120 with non-centrosymmetric crystal structure formed on the substrate 110, and may further include the protective film 130 formed on the ferromagnetic layer 120. The ferromagnetic layer 120 serves to store (write) information (data) according to the magnetization direction using current pulses and to sense (read) the information (data) through planar Hall resistance.

The ferromagnetic layer 120 may include a (III,M)(V) magnetic semiconductor with non-centrosymmetric crystal structure and a transition metal compound. Depending on example embodiments, the ferromagnetic layer 120 may include gallium manganese arsenide (GaMnAs) and manganese bismuth (MnBi).

In the following, since the structure of the MRAM device is apparent to one of ordinary skill in the art, description related to a configuration of the general MRAM device is omitted and description is focused on a configuration and an operation of a ferromagnetic layer with non-centrosymmetric crystal structure having in-plane biaxial anisotropy in a thin film, which corresponds to the core of the present invention.

The existing spin-orbit torque MRAM device employs a method of storing information by generating spin-current using the spin-Hall effect that occurs in a heavy metal (e.g., Pt, Ta, W, etc.) layer, by injecting the spin-current into a contacted ferromagnetic layer, and by adjusting magnetization of a magnetic layer through spin-orbit torque. In the magnetic material with non-centrosymmetric crystal structure employed by the present invention, the spin-orbit field (inducing carrier spin polarization) is generated when current flows in the magnetic layer itself by Dresselhaus effect and Rashba effect due to breaking of symmetry of the crystalline structure, and the spin polarization of carrier exerts spin-orbit torque to the magnetization of the magnetic layer itself so that the magnetization is controlled and information is stored according to each magnetization state. Therefore, as a method of improving the complex multilayer structure of the existing spin-orbit torque MRAM devices, the present invention may simplify an MRAM structure by simultaneously using spin-polarization occurrence and information storage according to the magnetization direction in a single magnetic layer with the non-centrosymmetric crystal structure instead of using multiple layers in which a spin polarization occurrence layer and an information storage magnetic layer are separately present.

Also, in the existing spin-orbit torque MRAM device based on a combination of heavy metal/ferromagnetic layers, when the ferromagnetic layer includes a material having perpendicular magnetic anisotropy (PMA), magnetization switching of the magnetic layer is impossible only with spin-orbit torque in the structure. For example, a simple combination of heavy metal and ferromagnetic layers requires assistance of external magnetic field to switch between up and down magnetic states. As such, the structure of the existing spin-orbit torque MRAM device structure requires the external magnetic field, which makes it unrealistic in terms of actual memory device application. For practical use, methods of replacing the necessary external magnetic field with the effective magnetic field using auxiliary layers in the structure are developed. However, this makes the device structure more complex and also makes the process more difficult, resulting in an increase in production cost.

To solve the aforementioned issues, the present invention uses the spin-orbit field (spin polarization) generated in a magnetic material with non-centrosymmetric crystal structure and in-plane biaxial anisotropy within the thin film plane. Thus, the SOT MRAM operates only with current pulses in a device consists of a single magnetic layer without the external magnetic field.

The magnetic material with non-centrosymmetric crystal structure used in the present invention causes the spin polarization due to the Dresselhaus effect and the Rashba effect in which the direction of spin polarization changes according to the crystalline direction of thin film through which the current flows. In particular, while the direction of the spin-orbit field due to the Rashba effect is always perpendicular to the current, the direction of the spin-orbit field due to the Dresselhaus effect is either perpendicular, parallel, or anti-parallel to the current depending on the crystalline direction. The present invention relates to a device operation using the spin polarization in which the Dresselhaus effect and the Rashba effect are combined and the following description is limited to magnetization switching by the entire spin-orbit field.

Figure 5:
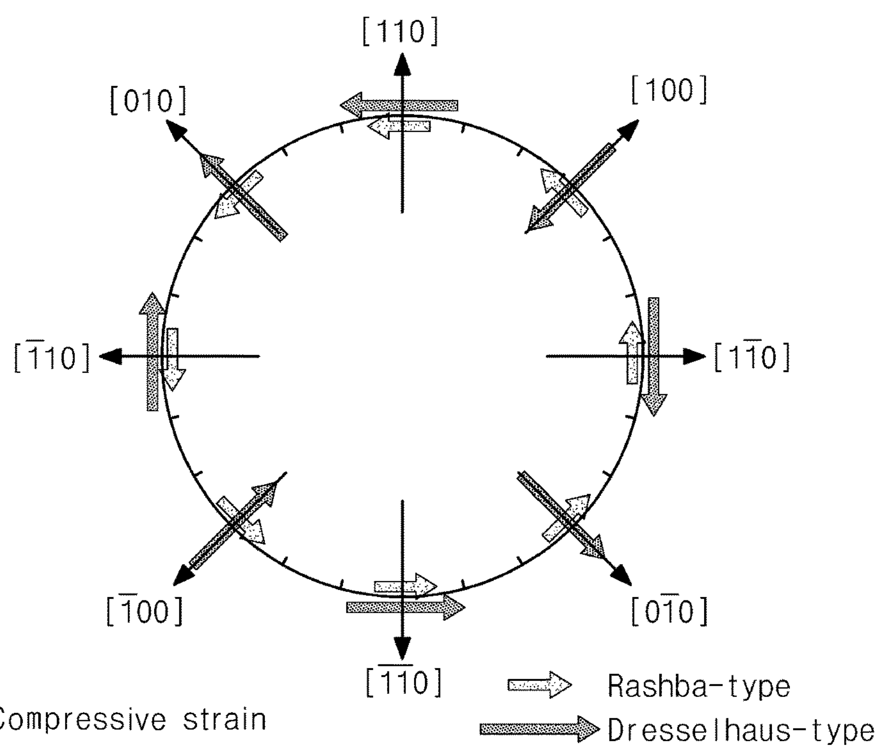
FIGS. 5 and 6 illustrate the spin-orbit field for compressive and tensile strained crystalline ferromagnetic material with a non-centrosymmetric crystal structure as an example of (III,M)(V) material.
Figure 6:
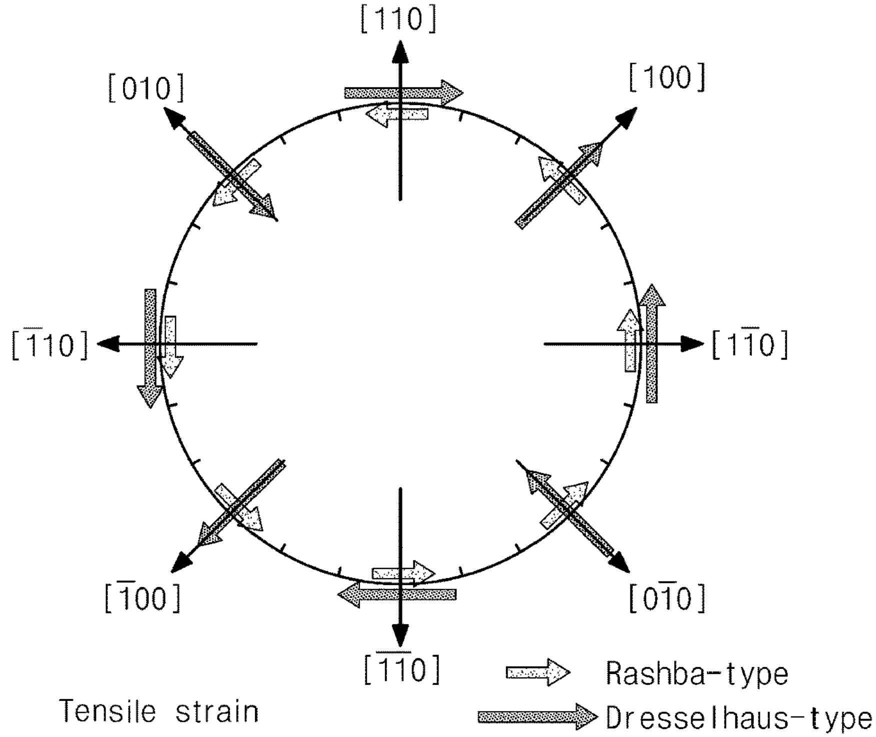

FIGS. 5 and 6 illustrate the spin-orbit field for compressive and tensile strained crystalline ferromagnetic material with a non-centrosymmetric crystal structure, an example of (III,M)(V) material.

Referring to FIGS. 5 and 6, when the current flows in the [110] direction, the spin-orbit field (spin polarization) is perpendicular to the current and forms an angle of 45 degrees (45±$\alpha$ depending on example embodiments, here, $\alpha$ denotes an arbitrary real number) with the [100] magnetic easy axis direction. Therefore, the spin-orbit field possesses a component of the easy magnetization axis and this component becomes an opposite direction for opposite current direction. Therefore, the magnetization of the ferromagnetic layer may be switched between easy magnetization axes of the thin film plane only with current pulses without the external magnetic field. The present invention configures the MRAM device through magnetization switching using only current pulses, based on a characteristic that the easy magnetization axis direction component of the spin-orbit field changes to an opposite direction depending on the current direction.

Figure 7:
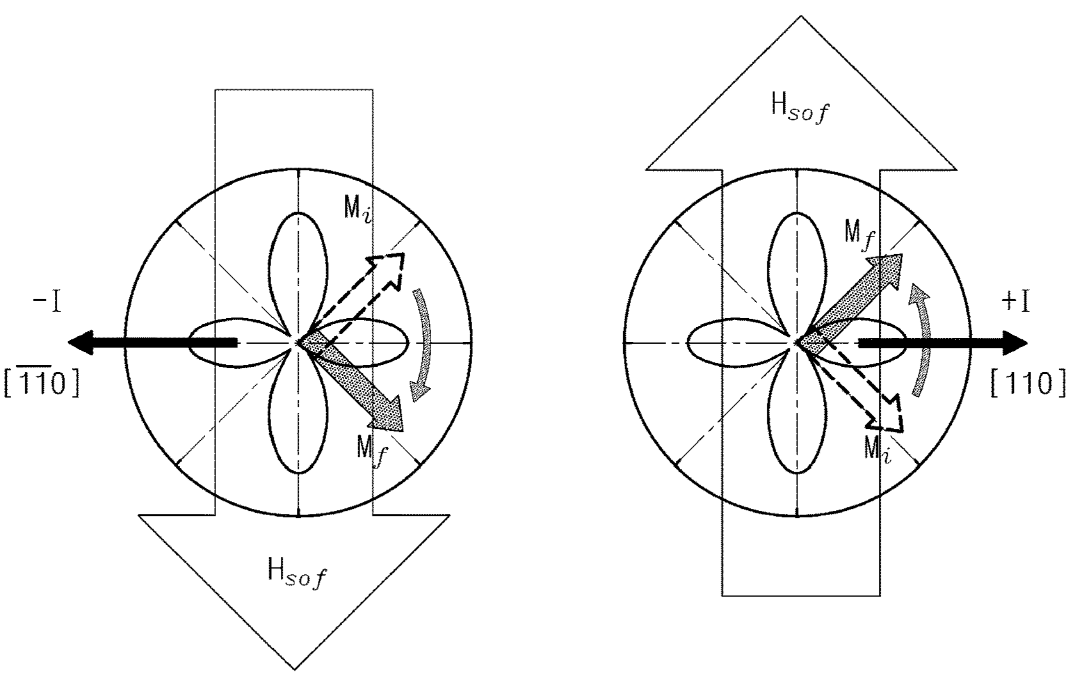
FIG. 7 illustrates a magnetization switching principle by a spin-orbit field that occurs when current flows positive or negative direction through a Hall device.

FIG. 7 illustrates a magnetization switching principle by a spin-orbit field that occurs when current flows positive or negative direction through a Hall device.

FIG. 7 illustrates a process in which $M_i$ and $M_f$ denote an initial magnetization direction and a subsequent magnetization direction after current pulse, respectively. When a negative current pulse is applied, the magnetization on the easy magnetization axis of the first quadrant switches to the easy magnetization axis of the fourth quadrant, and when a positive current pulse is applied, the magnetization on the easy magnetization axis of the fourth quadrant changes to the easy magnetization axis of the first quadrant. In FIG. 7, solid arrows pointing left and right represent the current direction and wide arrows pointing up and down represent the direction of the spin-orbit field corresponding to the current direction.

Figure 8:
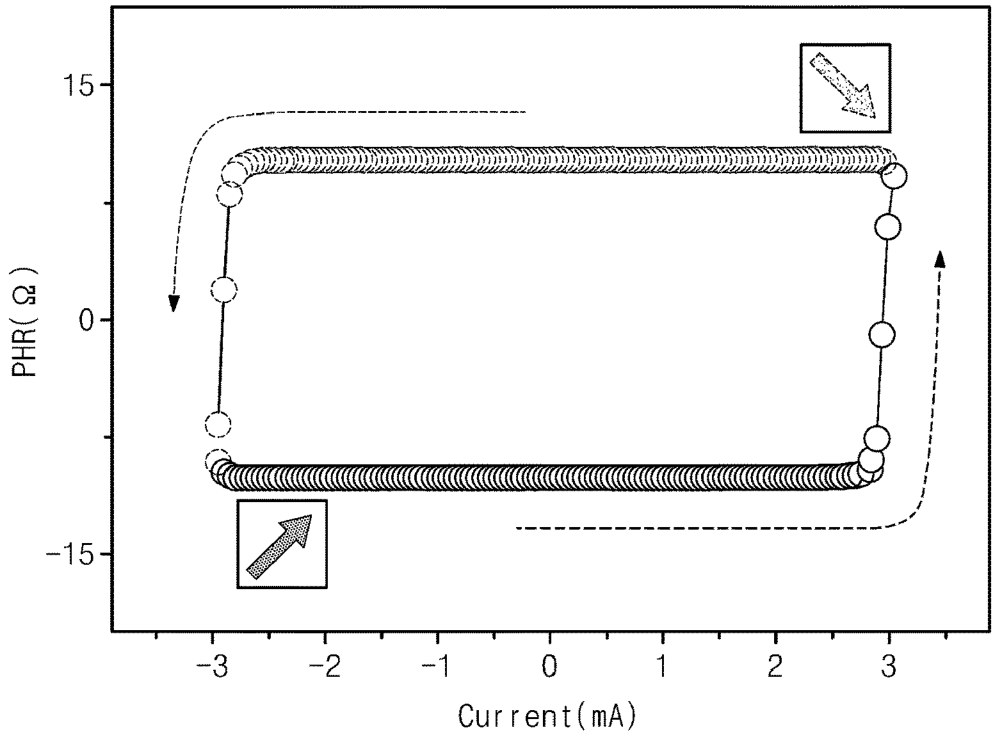
FIG. 8 illustrates planar Hall resistance (PHR) hysteresis in which magnetization switching occurs when current is scanned on a ferromagnetic film with biaxial anisotropy.

FIG. 8 illustrates hysteresis in which, when scanning current in a positive ([100]) crystalline direction and a negative ($[\bar{1}\bar{1}0]$) crystalline direction in a (GaMnAs) ferromagnetic film with biaxial anisotropy, magnetization switching occurs between the two easy axes and a planar Hall resistance value changes between positive and negative accordingly. In FIG. 8, the thin dotted arrow represents the scan direction of current and the thick arrow represents the magnetization direction corresponding to the resistance state. Therefore, even without the external magnetic field, the magnetization of the ferromagnetic layer within the thin film plane is controlled between two states only with the current-induced spin-orbit field. Referring to FIG. 8, since information is storable in a high resistance (or positive resistance) magnetization state and a low resistance (or negative resistance) magnetization state, it is possible to operate as a memory device.

Figure 9:
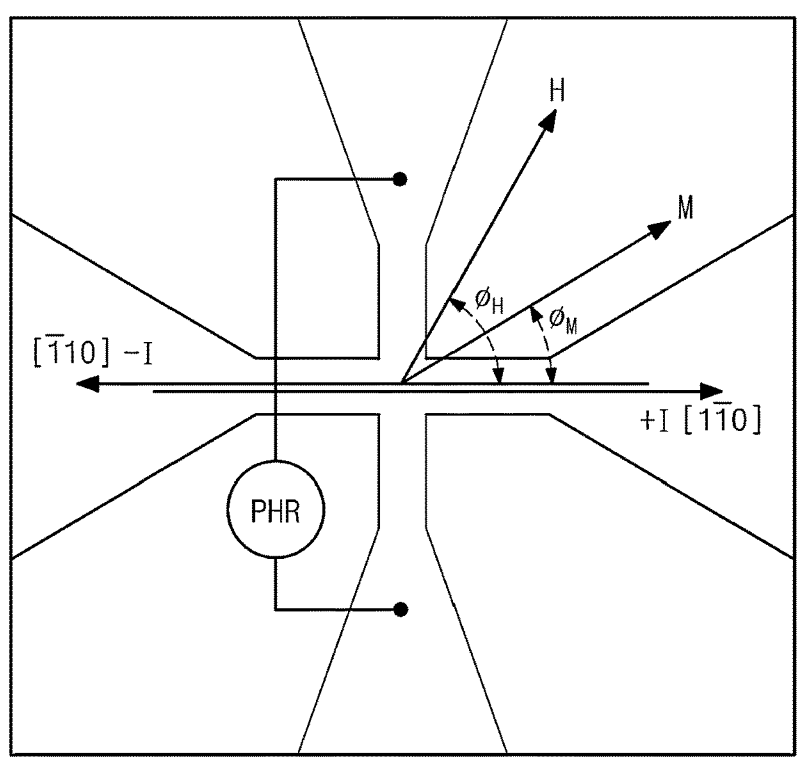
FIG. 9 illustrates an example of a Hall device formed of a single-layer ferromagnetic film and a planar Hall resistance measurement method according thereto.

FIG. 9 illustrates an example of a Hall device formed of a single-layer ferromagnetic film with in-plane biaxial anisotropy and a planar Hall resistance measurement method according thereto. That is, FIG. 9 is a conceptual diagram of a spin-orbit torque MRAM device in a form of a Hall device. The spin-orbit field is generated by flowing pulse-typed current into an information storage cell, in which information is stored via a magnetization state in the biaxial direction.

In FIG. 9, the MRAM device in a cross shape is formed only on the single-layer ferromagnetic film with a protective layer. By switching the direction of current pulse between the positive direction ([110]) and the negative direction ( $[\bar{1}\bar{1}0]$ ), the magnetization state can be switched between two easy magnetization axes. In the aforementioned way, information may be stored in the ferromagnetic layer. Also, the stored information can be read by measuring magnitude of a planar Hall resistance value or a magnetic resistance value through sensing current. Therefore, a single ferromagnetic layer simultaneously performs information storage and sensing roles.

Figure 10:
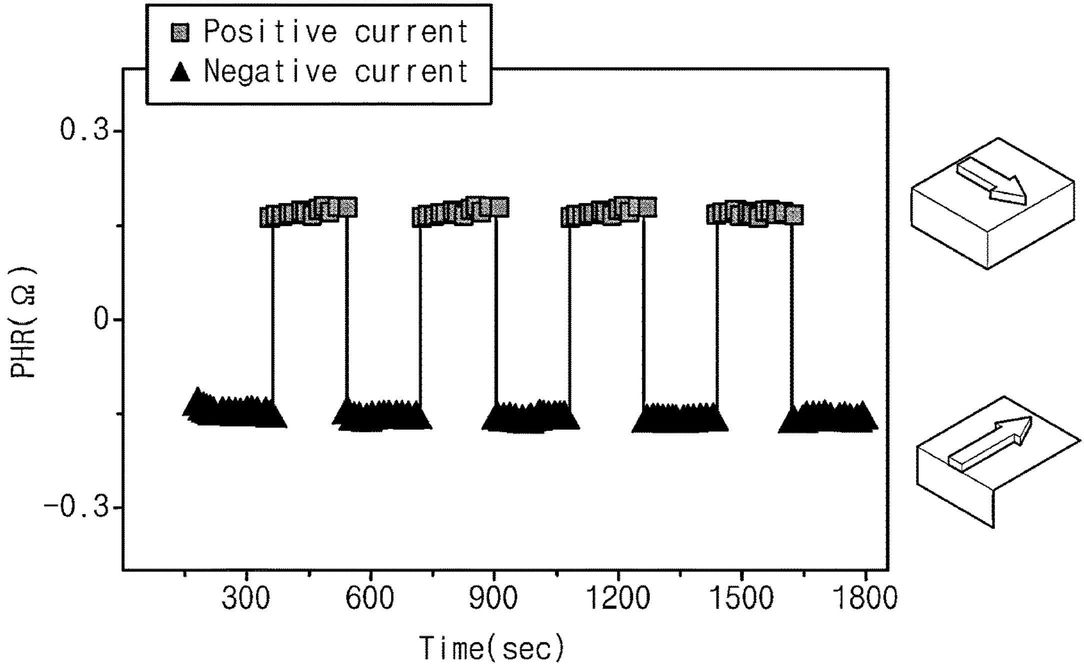
FIG. 10 illustrates a planar Hall resistance (PHR) change depending on the periodical application of alternating current (i.e., switching between positive and negative current) pulse.

FIG. 10 illustrates a planar Hall resistance (PHR) measurement value when periodically switching current pulses in a positive direction and a negative direction. When the direction of the current pulse switches, two Hall resistance states consistently switches in response to the magnetization state, showing that stable information storage, control, and sensing are possible. That is, adjusting the direction of current pulse, magnetization within a cell may be switched to a preferred direction.

Although the present invention is described with reference to the example embodiments illustrated in the drawings, it is provided as an example only and it will be apparent to one of ordinary skill in the art that various alterations and modifications in form and details may be made in these example embodiments without departing from the spirit and scope of the claims and their equivalents. For example, suitable results may be achieved if the described techniques are performed in a different order, and/or if components in a described system, architecture, device, or circuit are combined in a different manner, and/or replaced or supplemented by other components or their equivalents. Therefore, other implementations, other example embodiments, and equivalents are within the scope of the following claims.

What is claimed is:

1. A magnetic random access memory (MRAM) device comprising:

a substrate; and a ferromagnetic layer formed on the substrate, wherein the ferromagnetic layer has non-centrosymmetric crystal structure and biaxial in-plane anisotropy, and wherein during a write operation, a magnetization state of the ferromagnetic layer is switched by spin-orbit torque generated by a current applied to the ferromagnetic layer anisotropy.

2. The MRAM device of claim 1, wherein the ferromagnetic layer includes gallium manganese arsenide (GaMnAs) or manganese bismuth (MnBi).

3. The MRAM device of claim 1, wherein, during the write operation, a current in a first direction is applied to the ferromagnetic layer so that the magnetization state of the ferromagnetic layer switches from a first magnetization state to a second magnetization state.

4. The MRAM device of claim 3, wherein, during the write operation, a current in a second direction that is opposite to the first direction is applied to the ferromagnetic layer so that the magnetization state of the ferromagnetic layer switches from the second magnetization to the first magnetization state.

5. The MRAM device of claim 1, wherein, during a read operation, information stored in the MRAM device is identified based on a planar Hall resistance value of the ferromagnetic layer.

* * * * *